(12) United States Patent
Farzan et al.

(10) Patent No.: US 10,841,138 B2
(45) Date of Patent: Nov. 17, 2020

(54) PAM-4 CALIBRATION

(71) Applicant: Rambus Inc., Sunnyvale, CA (US)

(72) Inventors: Kamran Farzan, Toronto (CA); Aaron Ali, Holland Landing (CA)

(73) Assignee: Rambus Inc., San Jose, CA (US)

(*) Notice: Subject to any disclaimer, the term of this patent is extended or adjusted under 35 U.S.C. 154(b) by 0 days.

(21) Appl. No.: 16/441,692

(22) Filed: Jun. 14, 2019

(65) Prior Publication Data

US 2019/0394071 A1 Dec. 26, 2019

Related U.S. Application Data

(60) Provisional application No. 62/688,687, filed on Jun. 22, 2018.

(51) Int. Cl.
| | | |
|---|---|---|
| *H04L 25/49* | (2006.01) | |
| *H04L 25/02* | (2006.01) | |
| *H03H 7/38* | (2006.01) | |
| *H03K 7/02* | (2006.01) | |
| *H04B 14/02* | (2006.01) | |
| *H03K 5/24* | (2006.01) | |

(52) U.S. Cl.
CPC .......... *H04L 25/4917* (2013.01); *H03H 7/38* (2013.01); *H03K 7/02* (2013.01); *H04B 14/023* (2013.01); *H04L 25/0272* (2013.01); *H04L 25/0282* (2013.01); *H03K 5/24* (2013.01)

(58) Field of Classification Search
CPC ...... H03H 7/38; H03H 2007/386; H03K 5/24; H03K 7/00; H03K 7/02; H04B 14/02; H04B 14/023; H04L 25/0272; H04L 25/0274; H04L 25/0276; H04L 25/0278; H04L 25/0282; H04L 25/0286; H04L 25/4917; H04L 25/4919
USPC ....... 375/219, 220, 222, 239, 257, 258, 353; 329/311, 313; 332/112, 115
See application file for complete search history.

(56) References Cited

U.S. PATENT DOCUMENTS

| | | |
|---|---|---|
| 6,772,351 B1 | 8/2004 | Werner et al. |
| 7,161,513 B2 | 1/2007 | Werner et al. |
| 7,221,196 B2 | 5/2007 | Shirani |
| 7,456,778 B2 | 11/2008 | Werner et al. |
| 7,626,442 B2 | 12/2009 | Zerbe et al. |
| 2005/0134305 A1* | 6/2005 | Stojanovic ............ H04L 25/028 326/31 |

(Continued)

*Primary Examiner* — Young T. Tse
(74) *Attorney, Agent, or Firm* — The Neudeck Law Firm, LLC

(57) ABSTRACT

A hybrid voltage mode (VM) and current mode (CM) four-level pulse amplitude modulation (PAM-4) transmitter circuits (a.k.a. drivers) is calibrated using a configurable replica circuit and calibration control circuitry. The replica circuit includes an on-chip termination impedance to mimic a receiver's termination impedance. The amount of level enhancement provided by the current mode circuitry is calibrated by adjusting the current provided to the output node and sunk from the output node by the replica current mode circuitry while the replica voltage mode circuitry is driving an intermediate PAM-4 level. After the level enhancement has been set, the non-linearity between levels is calibrated by adjusting the amount of current provided to the output node by the replica current mode circuitry while the replica voltage mode circuitry is driving a maximum output voltage level.

20 Claims, 12 Drawing Sheets

(56) References Cited

U.S. PATENT DOCUMENTS

| | | | |
|---|---|---|---|
| 2010/0164539 A1* | 7/2010 | Balamurugan | ............................ H03K 19/018585 326/30 |
| 2016/0204768 A1* | 7/2016 | Luo | ................ H03K 19/017509 327/108 |
| 2018/0248577 A1* | 8/2018 | Hossain | .............. H04L 25/0264 |
| 2019/0044768 A1* | 2/2019 | Kim | .................... H04B 14/023 |

* cited by examiner

PAM-4 CALIBRATION

DETAILED DESCRIPTION OF THE EMBODIMENTS

In an embodiment, one or more hybrid voltage mode (VM) current mode (CM) four-level pulse amplitude modulation (PAM-4) transmitter circuits (a.k.a. drivers) are calibrated using a configurable replica circuit and calibration control circuitry. The replica circuit includes an on-chip termination impedance to mimic a receiver's termination impedance. The current mode circuitry of the replica is disabled while a voltage mode calibration is performed to match the voltage mode output impedance to a selected value (e.g., 50Ω.) The amount of level enhancement provided by the current mode circuitry is calibrated by adjusting the current provided to the output node and sunk from the output node by the replica current mode circuitry while the replica voltage mode circuitry is driving an intermediate PAM-4 level (e.g., most significant bit driver is on while the least significant bit driver is off.) After the level enhancement has been set, the non-linearity (e.g., ratio level mismatch) between levels is calibrated. The non-linearity is calibrated by adjusting the amount of current provided to the output node by the replica current mode circuitry while the replica voltage mode circuitry is driving a maximum output voltage level (e.g., most significant bit driver and the least significant bit driver are both on.)

Figure 1:
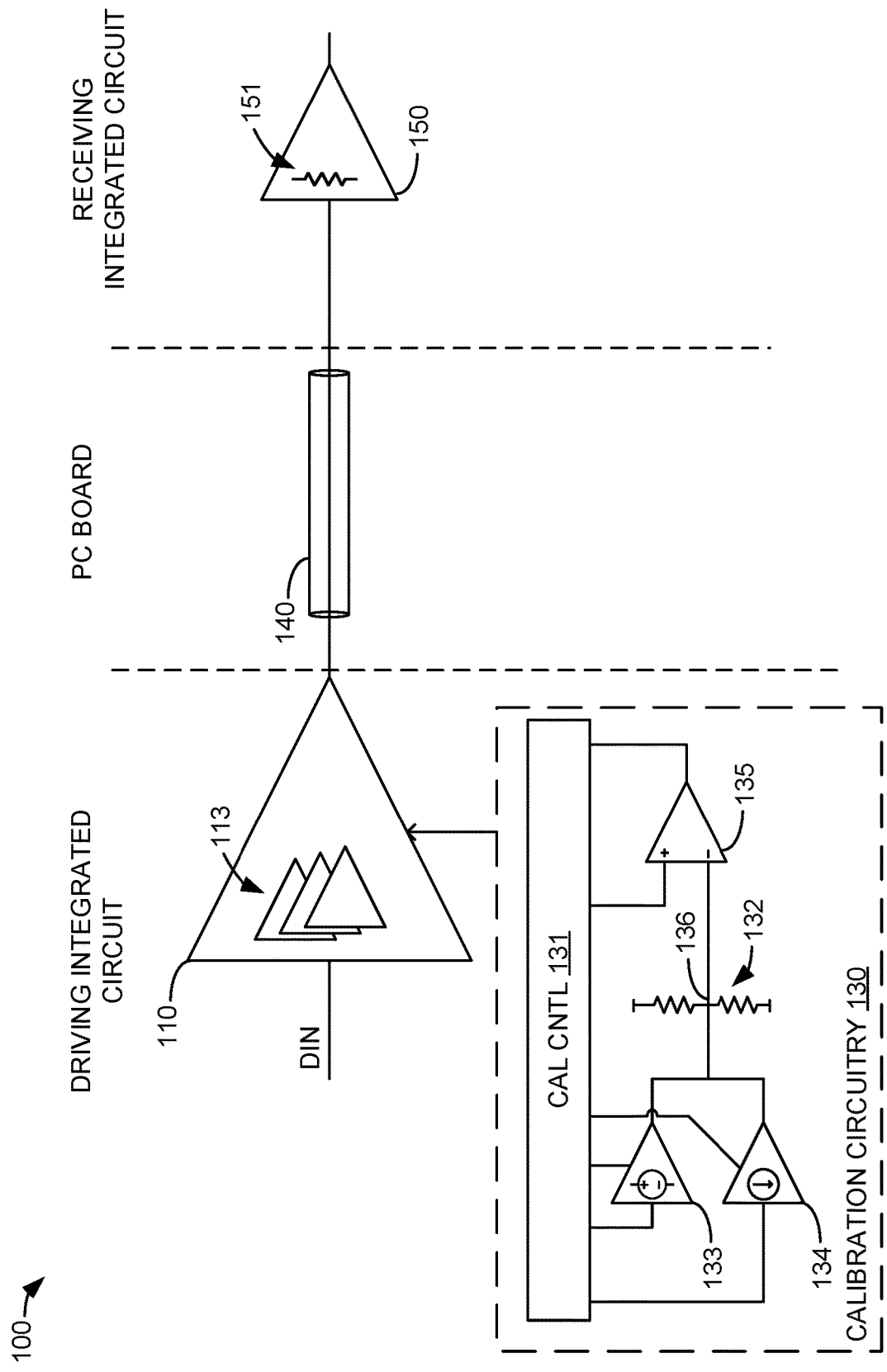
FIG. 1 is a diagram illustrating an embodiment of a communication system with PAM-4 driver calibration.

FIG. 1 is a diagram illustrating an embodiment of a communication system with PAM-4 driver calibration. Communication system 100 comprises a driving integrated circuit, a receiving integrated circuit, and interconnect between them. The driving integrated circuit includes transmitter circuit 110 (a.k.a., a driver) and calibration circuitry 130. Transmitter circuit 110 includes multiple voltage mode output stages 113 that may be selectively enabled/disabled (e.g., by calibration circuitry 130) to achieve a desired termination impedance (e.g., 50Ω.)

The receiver integrated circuit included receiver circuit 150. Receiver circuit includes termination impedance 151. The interconnect between the driving integrated circuit and the receiving integrated circuit comprises interconnect system 140. Interconnect system 140 would typically comprise a printed circuit (PC) board, connector, cable, flex circuit, other substrate, and/or a combination of these. Interconnect system 140 may be and/or include one or more transmission lines.

Receiver circuit 150 would typically be part of an integrated circuit that is receiving the signal sent by the driving integrated circuit. It should be understood that although system 100 is illustrated as transmitting a single-ended signal, the signals sent by the driving integrated circuit of system 100 may represent one of a pair of differential signals or one of a collection of signals sending multi-wire-coded data.

In FIG. 1, the output of transmitter circuit 110 is connected to a first end of interconnect system 140. The second end of interconnect system 140 is connected to the input of receiver 150. In an embodiment, transmitter circuit 110 is configured to drive PAM-4 signaling levels. Transmitter circuit 110 includes both voltage mode and current mode circuitry to drive the PAM-4 signaling. Transmitter circuit 110 is operatively coupled to calibration circuitry 130.

At least the PAM-4 levels driven by, and the output impedance of, driver 110 are determined at least in part by calibration circuitry 130. Calibration circuitry 130 may, for example, provide control signals that determine the number of voltage mode output stages 113 that are enabled and/or disabled.

Calibration circuitry 130 provides control currents that determine the amounts of current that are sourced to and/or sunk from the output node by the current mode circuitry of transmitter circuit 110. One or more of these amounts of currents may determine the amount of differential (or single-ended) swing enhancement provided by the current mode circuitry of transmitter circuit 110. One or more of these amounts of current may also help reduce non-linearities (i.e., ratio level mismatch—RLM) between the PAM-4 signaling levels output by transmitter circuit 110.

Calibration circuitry 130 includes calibration control circuitry 131, replica receiver termination impedance 132, replica voltage mode circuitry 133, replica current mode circuitry 134, and comparator 135. Replica receiver termination impedance 132 is configured to simulate receiver termination impedance 151. Replica voltage mode circuitry 133 is configured to match and/or simulate at least part of the voltage mode circuitry of transmitter circuit 110. Replica current mode circuitry 133 is configured to match and/or simulate at least part of the current mode circuitry of transmitter circuit 110.

Calibration control 131 is operatively coupled to replica voltage mode circuitry 133. Calibration control 131 is operatively coupled to replica voltage mode circuitry 133 to control the value (e.g., which PAM-4 level) driven by voltage mode circuitry and to control the output impedance of voltage mode circuitry 133. The output of voltage mode circuitry 133 is connected to replica receiver termination impedance 132. Thus, the output of voltage mode circuitry 133 is connected to a 'simulated' output node 136 (i.e., a node that simulates the impedance seen by transmitter 110 at the input to interconnect 140).

Calibration control 131 is also operatively coupled to replica current mode circuitry 134. Calibration control 131 is operatively coupled to replica current mode circuitry 134 to control the value (e.g., which PAM-4 level) driven by current mode circuitry 134 and to control the currents sourced to, and sunk from, the simulated output node 136. Thus, the output of current mode circuitry 134 is connected to replica receiver termination impedance 132.

Calibration control 131 is also operatively coupled to comparator 135. A first input to comparator 135 is controlled by calibration control 131. A second input to comparator 135 is connected to the simulated output node 136. The output of comparator 135 is sent to calibration control 131. Thus, calibration control 131 may set voltages at the first input to comparator 135 and then adjust various parameters of voltage mode circuitry 133 and current mode circuitry 134 while comparator 135 informs calibration control 131 whether the voltage on the simulated output node 136 is greater than or less than the set voltages.

Calibration control 131 determines the number of voltage mode output stages 113 that are enabled/disabled in order to achieve a desired termination impedance. To make that determination, calibration control 131 disables current mode circuitry 134 and any pulldown circuitry in voltage mode circuitry 133. Calibration control 131 also applies a first desired PAM-4 level (e.g., the voltage corresponding to the highest PAM-4 output voltage) to the first input of comparator 135. Calibration control 131 may then selectively enable and/or disable portions of the pullup circuitry in voltage mode circuitry 133 until the voltage on the simulated output node 136 is substantially equal to the first desired PAM-4 level. When the voltage on the simulated output node 136 is substantially equal to the first desired PAM-4 level, the output impedance of the enabled portions of the pullup circuitry in voltage mode circuitry 133 is substantially equal to the desired termination impedance.

Calibration control 131 also disables current mode circuitry 134 and any pullup circuitry in voltage mode circuitry 133. Calibration control 131 applies a second desired PAM-4 level (e.g., the voltage corresponding to the lowest PAM-4 output voltage) to the first input of comparator 135. Calibration control 131 may then selectively enable and/or disable portions of the pulldown circuitry in voltage mode circuitry 133 until the voltage on the simulated output node 136 is substantially equal to the second desired PAM-4 level. When the voltage on the simulated output node 136 is substantially equal to the second desired PAM-4 level, the output impedance of the enabled portions of the pulldown circuitry in voltage mode circuitry 133 is substantially equal to the desired termination impedance.

After calibration control 131 determines the number of voltage mode output stages 113 that are enabled/disabled in order to achieve a desired termination impedance, calibration control determines the amount of currents that are sourced and/or sunk to simulated output node 136 by current mode circuitry 134 to achieve a desired differential swing enhancement. To make that determination, calibration control 131 enables the most significant bit drivers and disables the least significant bit drivers of voltage mode circuitry 133. Calibration control 131 also applies a first desired voltage level to the first input of comparator 135 (e.g., a voltage corresponding to an enhanced upper-middle PAM-4 output voltage—e.g., $[7/12]*V_{DD}+\Delta V/12$, where $\Delta V$ is the desired amount of differential swing enhancement). Calibration control 131 may then selectively adjust the amount of current sourced to simulated output node 136 (i.e., by the MSB pullup circuitry of current mode circuitry 134) and the amount of current sunk from simulated output node 136 (i.e., by the LSB pulldown circuitry of current mode circuitry 134) until the voltage on the simulated output node 136 is substantially equal to the first desired voltage level. When the voltage on the simulated output node 136 is substantially equal to the first desired voltage, the MSB pullup current and the LSB pulldown current are substantially set to produce the desired amount of differential swing enhancement.

Calibration control also determines the amount of currents that are sourced to simulated output node 136 by current mode circuitry 134 to reduce non-linearity in the PAM-4 output levels. To make that determination, calibration control 131 enables both the most significant bit drivers and the least significant bit drivers of voltage mode circuitry 133. Calibration control 131 also applies a second desired voltage level to the first input of comparator 135 (e.g., a voltage corresponding to an enhanced upper-middle PAM-4 output voltage—e.g., $[3/4]*V_{DD}+\Delta V/4$, where $\Delta V$ is the amount of differential swing enhancement). Calibration control 131 may then selectively adjust the amount of current sourced to simulated output node 136 by the MSB pullup circuitry and the LSB pullup circuitry of current mode circuitry 134) until the voltage on the simulated output node 136 is substantially equal to the second desired voltage level. When the voltage on the simulated output node 136 is substantially equal to the second desired voltage, the MSB pullup current and the LSB pullup current are set to reduce to substantially reduce non-linearity in the PAM-4 output levels (i.e., RLM).

Figure 2:
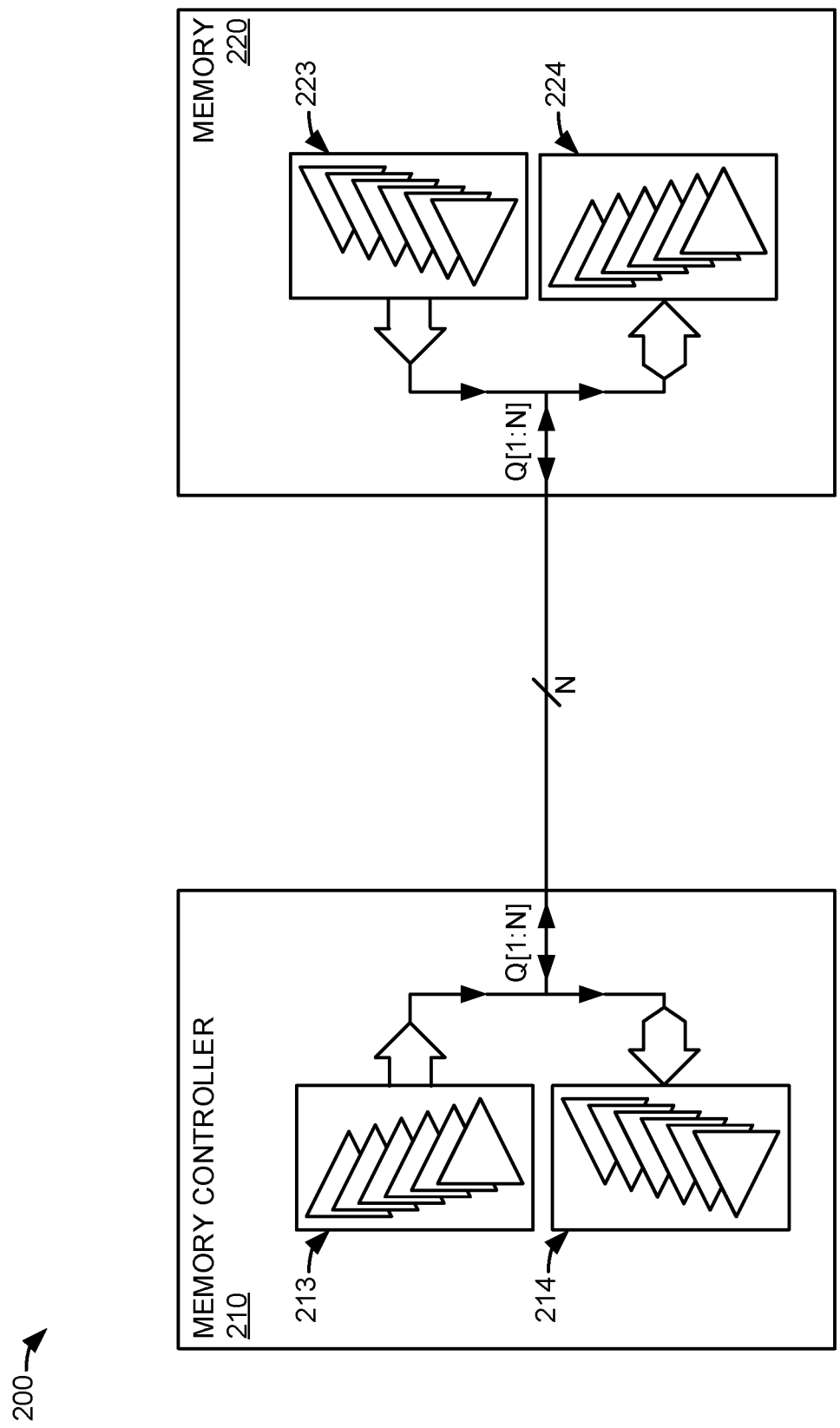
FIG. 2 is a diagram illustrating a memory system

FIG. 2 is a block diagram illustrating a memory system. In FIG. 2, memory system 200 comprises memory controller 210 and memory 220. Memory controller 210 includes drivers 213 and receivers 214. Memory controller 210 also includes N number of signal ports Q[1:N] that may be driven by one or more of drivers 213 and may receive signals to be sampled by one or more of receivers 214. Memory 220 includes drivers 223 and receivers 224. Memory 220 also includes N number of signal ports Q[1:N] that may be driven by one or more of drivers 223 and may receive signals to be sampled by one or more of receivers 224. Signal ports Q[1:N] of memory controller 210 are operatively coupled to ports Q[1:N] of memory 220, respectively. Receivers 224 of memory 220 may receive one or more of the Q[1:N] signals from memory controller 210. Receivers 214 of memory controller 210 may receive one or more of the Q[1:N] signals from memory 220.

One or more of drivers 213 when configured and coupled with a corresponding one or more receivers 224 may form a PAM-4 signaling system. Thus, one or more of drivers 213 of memory controller 210 may correspond to transmitter circuit 110, discussed previously, or correspond to a transmitter circuit discussed herein subsequently. One or more of drivers 213 of memory controller 210 may be calibrated for termination impedance, current mode enhancement, and non-linearity as described herein. One or more of receivers 214 of memory controller 210 may correspond to receiver 150, discussed previously, or correspond to a receiver circuit discussed herein subsequently.

One or more of drivers 223 when configured and coupled with a corresponding one or more receivers 214 may form a PAM-4 signaling system. Thus, one or more of drivers 223 of memory 220 may correspond to transmitter circuit 110, discussed previously, or correspond to a transmitter circuit discussed herein subsequently. One or more of drivers 223 of memory 220 may be calibrated for termination impedance, current mode enhancement, and non-linearity as described herein. One or more of receivers 224 of memory 220 may correspond to receiver 150, discussed previously, or correspond to a receiver circuit discussed herein subsequently.

Memory controller 210 and memory 220 are integrated circuit type devices, such as one commonly referred to as a "chip". A memory controller, such as memory controller 210, manages the flow of data going to and from memory devices, such as memory 220. For example, a memory controller may be a northbridge chip, an application specific integrated circuit (ASIC) device, a graphics processor unit (GPU), a system-on-chip (SoC) or an integrated circuit device that includes many circuit blocks such as ones selected from graphics cores, processor cores, and MPEG encoder/decoders, etc. Memory 220 can include a dynamic random access memory (DRAM) core or other type of memory cores, for example, static random access memory (SRAM) cores, or non-volatile memory cores such as flash. In addition, although the embodiments presented herein with respect to FIG. 2 describe a memory controller and components, the instant apparatus and methods may also apply to other interfaces that effectuate PAM-4 signaling between separate integrated circuit devices.

It should be understood that signal ports Q[1:N] of both memory controller 210 and memory 220 may correspond to any input or output pins (or balls) of memory controller 210 or memory 220 that transmit information between memory controller 210 and memory 220. For example, signal ports Q[1:N] can correspond to bidirectional data pins (or pad means) used to communicate read and write data between memory controller 210 and memory 220. The data pins may also be referred to as "DQ" pins. Thus, for a memory 220 that reads and writes data up to 16 bits at a time, signal ports Q[1:N] can be seen as corresponding to pins DQ[0:15]. In another example, signal ports Q[1:N] can correspond to one or more unidirectional command/address (C/A) bus. Signal ports Q[1:N] can correspond to one or more unidirectional control inputs. Thus, signal ports Q[1:N] on memory controller 210 and memory 220 may correspond to inputs such as CS (chip select), a command interface that includes timing control strobes such as RAS and CAS, address pins A[0:P] (i.e., address pins carrying address bits), DQ[0:X] (i.e., data pins carrying data bits), etc., and other inputs/outputs in past, present, or future devices.

Figure 3:
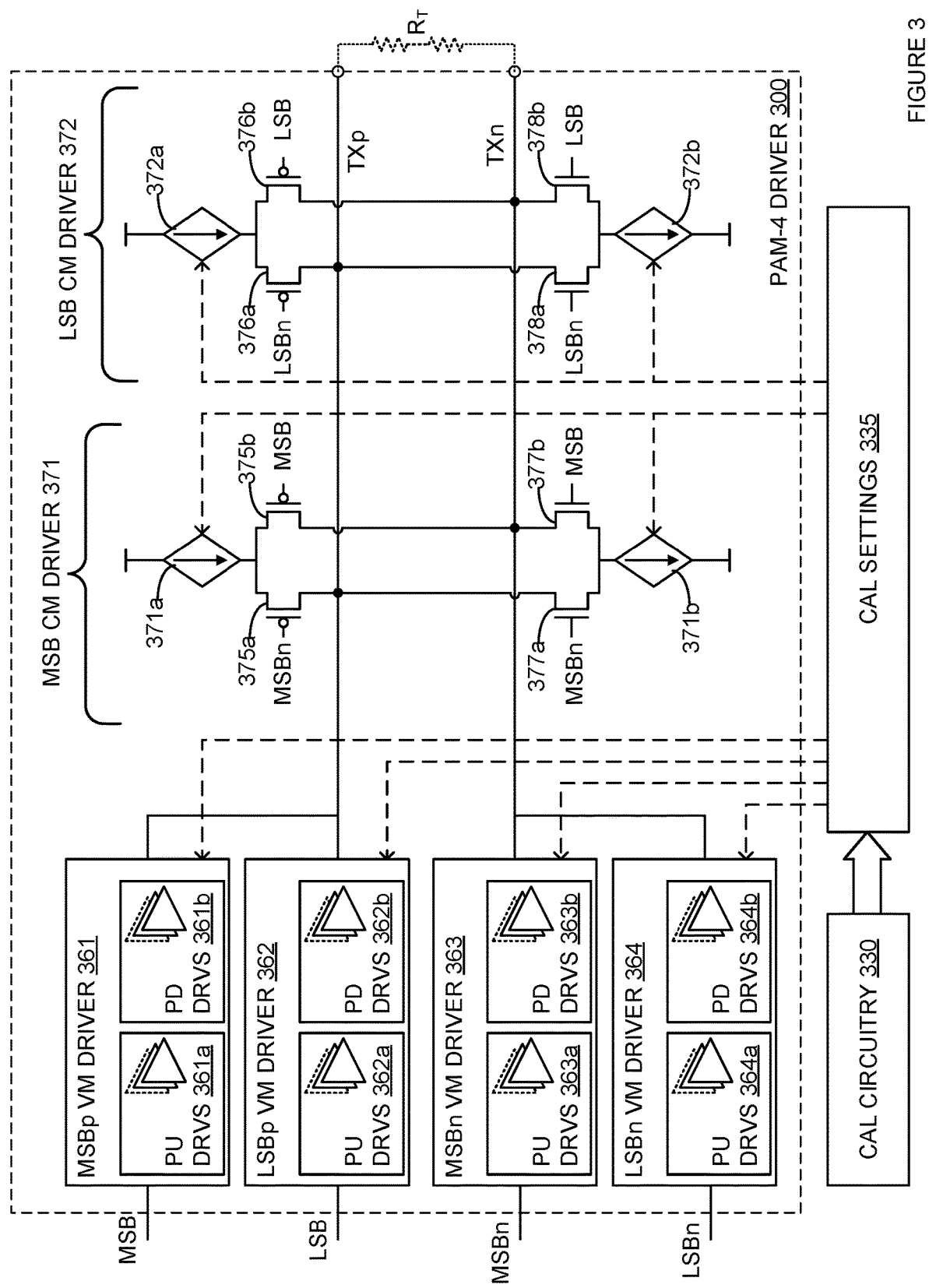
FIG. 3 is a diagram illustrating a hybrid voltage mode/current mode PAM-4 driver.

FIG. 3 is a diagram illustrating a hybrid voltage mode/current mode PAM-4 driver. In FIG. 3, PAM-4 driver 300 is a differential PAM-4 driver. PAM-4 driver 300 comprises most significant bit positive (MSBp) voltage mode driver 361, least significant bit positive (LSBp) voltage mode driver 362, most significant bit negative (MSBn) voltage mode driver 363, least significant bit negative (LSBn) voltage mode driver 364, most significant bit current mode driver 371, and least significant bit current mode driver 372. Calibration circuitry 330 determines calibration settings 335 that are provided to PAM-4 driver 300. The differential output nodes TXp and TXn of PAM-4 driver are typically connected via an interconnect (e.g., interconnect 140) to a receiver termination impedance. This is illustrated in FIG. 3 by $R_T$ (shown using dotted lines to indicate it is not part of the driving integrated circuit.)

The most significant bit to be transmitted by PAM-4 driver 300 is provided by the complementary signals MSB and MSBn. MSB is provided to MSBp VM driver 361. MSBn (the logical complement/inversion of MSB) is provided to MSBn VM driver 363. The least significant bit to be transmitted by PAM-4 driver 300 is provided by the complementary signals LSB and LSBn. LSB is provided to LSBp VM driver 362. LSBn (the logical complement/inversion of LSB) is provided to LSBn VM driver 364. The outputs of MSBp VM driver 361 and LSBp VM driver 362 are connected to the positive transmit/output node TXp. The outputs of MSBn VM driver 363 and LSBn VM driver 364 are connected to the negative transmit/output node TXn.

MSBp VM driver 361 includes pullup drivers 361a and pulldown drivers 361b. Pullup drivers 361a may be, for example, selectively enabled/disabled p-channel field-effect transistors (PFETs). Pullup drivers 361a may be selectively enabled/disabled according to calibration settings 335. Pullup drivers 361a may be selectively enabled/disabled according to calibration settings 335 in order to provide a selected termination/drive impedance when pullup drivers 361a are driving (e.g., 3 $R_L$/2 where $R_L$ is ½ the receiver termination impedance—$R_T$). Similarly, pulldown drivers 361b may be, for example, selectively enabled/disabled n-channel field-effect transistors (NFETs). Pulldown drivers 361b may be selectively enabled/disabled according to calibration settings 335. Pulldown drivers 361b may be selectively enabled/disabled according to calibration settings 335 in order to provide a selected termination/drive impedance when pulldown drivers 361b are driving (e.g., 3 $R_L$/2 where $R_L$ is ½ the receiver termination impedance—$R_T$).

LSBp VM driver 362 includes pullup drivers 362a and pulldown drivers 362b. Pullup drivers 362a may be, for example, selectively enabled/disabled PFETs. Pullup drivers 362a may be selectively enabled/disabled according to calibration settings 335. Pullup drivers 362a may be selectively enabled/disabled according to calibration settings 335 in order to provide a selected termination/drive impedance when pullup drivers 362a are driving (e.g., 3 $R_L$.) Similarly, pulldown drivers 362b may be, for example, selectively enabled/disabled NFETs. Pulldown drivers 362b may be selectively enabled/disabled according to calibration settings 335. Pulldown drivers 362b may be selectively enabled/disabled according to calibration settings 335 in order to provide a selected termination/drive impedance when pulldown drivers 362b are driving (e.g., 3 $R_L$.)

MSBn VM driver 363 includes pullup drivers 363a and pulldown drivers 363b. Pullup drivers 363a may be, for example, selectively enabled/disabled PFETs. Pullup drivers 363a may be selectively enabled/disabled according to calibration settings 335. Pullup drivers 363a may be selectively enabled/disabled according to calibration settings 335 in order to provide a selected termination/drive impedance when pullup drivers 363a are driving (e.g., 3 $R_L$/2). Similarly, pulldown drivers 363b may be, for example, selectively enabled/disabled NFETs. Pulldown drivers 363b may be selectively enabled/disabled according to calibration settings 335. Pulldown drivers 363b may be selectively enabled/disabled according to calibration settings 335 in order to provide a selected termination/drive impedance when pulldown drivers 363b are driving (e.g., 3 $R_L$/2.)

LSBn VM driver 364 includes pullup drivers 364a and pulldown drivers 364b. Pullup drivers 364a may be, for example, selectively enabled/disabled PFETs. Pullup drivers 364a may be selectively enabled/disabled according to calibration settings 335. Pullup drivers 364a may be selectively enabled/disabled according to calibration settings 335 in order to provide a selected termination/drive impedance when pullup drivers 364a are driving (e.g., 3 $R_L$.) Similarly, pulldown drivers 364b may be, for example, selectively enabled/disabled NFETs. Pulldown drivers 364b may be selectively enabled/disabled according to calibration settings 335. Pulldown drivers 364b may be selectively enabled/disabled according to calibration settings 335 in order to provide a selected termination/drive impedance when pulldown drivers 364b are driving (e.g., 3 $R_L$.)

MSB CM driver 371 includes controlled current source 371a, controlled current source 371b, PFET 375a, PFET 375b, NFET 377a, and NFET 377b. Controlled current source 371a sources a controlled current (e.g., from a positive supply voltage-$V_{DD}$) to the (connected together) source nodes of PFET 375a and PFET 375b. Controlled current source 371b sinks a controlled current from the (connected together) source nodes of NFET 377a and NFET 377b (e.g., to a negative supply voltage-$V_{ss}$.) The gate of PFET 375a is connected to MSBn. The drain of PFET 375a is connected to TXp. The gate of PFET 375b is connected to MSB. The drain of PFET 375b is connected to TXn. The gate of NFET 377a is connected to MSBn. The drain of NFET 377a is connected to TXp. The gate of NFET 377b is connected to MSB. The drain of NFET 377b is connected to TXn.

LSB CM driver 372 includes controlled current source 372a, controlled current source 372b, PFET 376a, PFET 376b, NFET 378a, and NFET 378b. Controlled current source 372a sources a controlled current (e.g., from a positive supply voltage-$V_{DD}$) to the (connected together) source nodes of PFET 376a and PFET 376b. Controlled current source 372b sinks a controlled current from the (connected together) source nodes of NFET 378a and NFET 378b (e.g., to a negative supply voltage-$V_{ss}$.) The gate of PFET 376a is connected to LSBn. The drain of PFET 376a is connected to TXp. The gate of PFET 376b is connected to LSB. The drain of PFET 376b is connected to TXn. The gate of NFET 378a is connected to LSBn. The drain of NFET 378a is connected to TXp. The gate of NFET 378b is connected to LSB. The drain of NFET 378b is connected to TXn.

The current flowing through controlled current source 371a is set according to calibration settings 335. The current flowing through controlled current source 371b is set according to calibration settings 335. The currents flowing through controlled current source 371a and the current flowing through controlled current source 371b may be set to be substantially equal (e.g., $I_{MSB}$—the amount of current to be sourced/sunk under the control of the MSB value input to MSB CM driver 371.) The currents flowing through controlled current source 371a and controlled current source 371b may be set according to calibration settings 335 in order to provide a selected differential swing enhancement and/or to remove non-linearity from the PAM-4 levels output by PAM-4 driver 300.

Similarly, the current flowing through controlled current source 372a is set according to calibration settings 335. The current flowing through controlled current source 372b is set according to calibration settings 335. The currents flowing through controlled current source 372a and the current flowing through controlled current source 372b may be set to be substantially equal (e.g., $I_{LSB}$—the amount of current to be sourced/sunk under the control of the LSB value input to LSB CM driver 372.) The currents flowing through controlled current source 372a and controlled current source 372b may be set according to calibration settings 335 in order to provide a selected differential swing enhancement and/or to remove non-linearity from the PAM-4 levels output by PAM-4 driver 300. In an example, $I_{MSB}+I_{LSB} \approx I_S$ where $I_{MSB} \approx (2/3)*I_S$ and $I_{LSB} \approx (1/3)*I_S$.

Figure 4A:
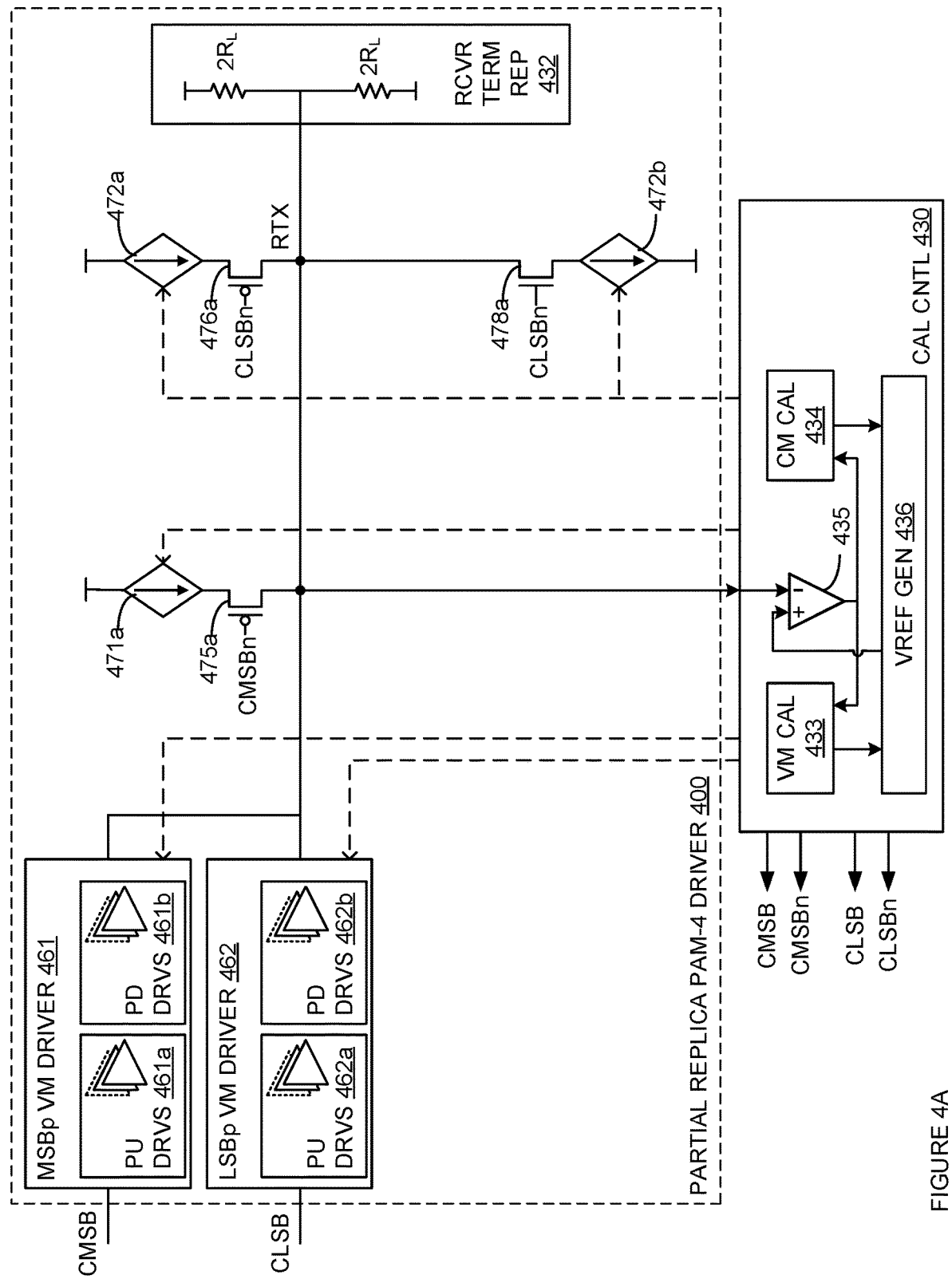
FIG. 4A is a diagram illustrating PAM-4 calibration circuitry that uses a partial replica PAM-4 driver for calibration.
Figure 4B:
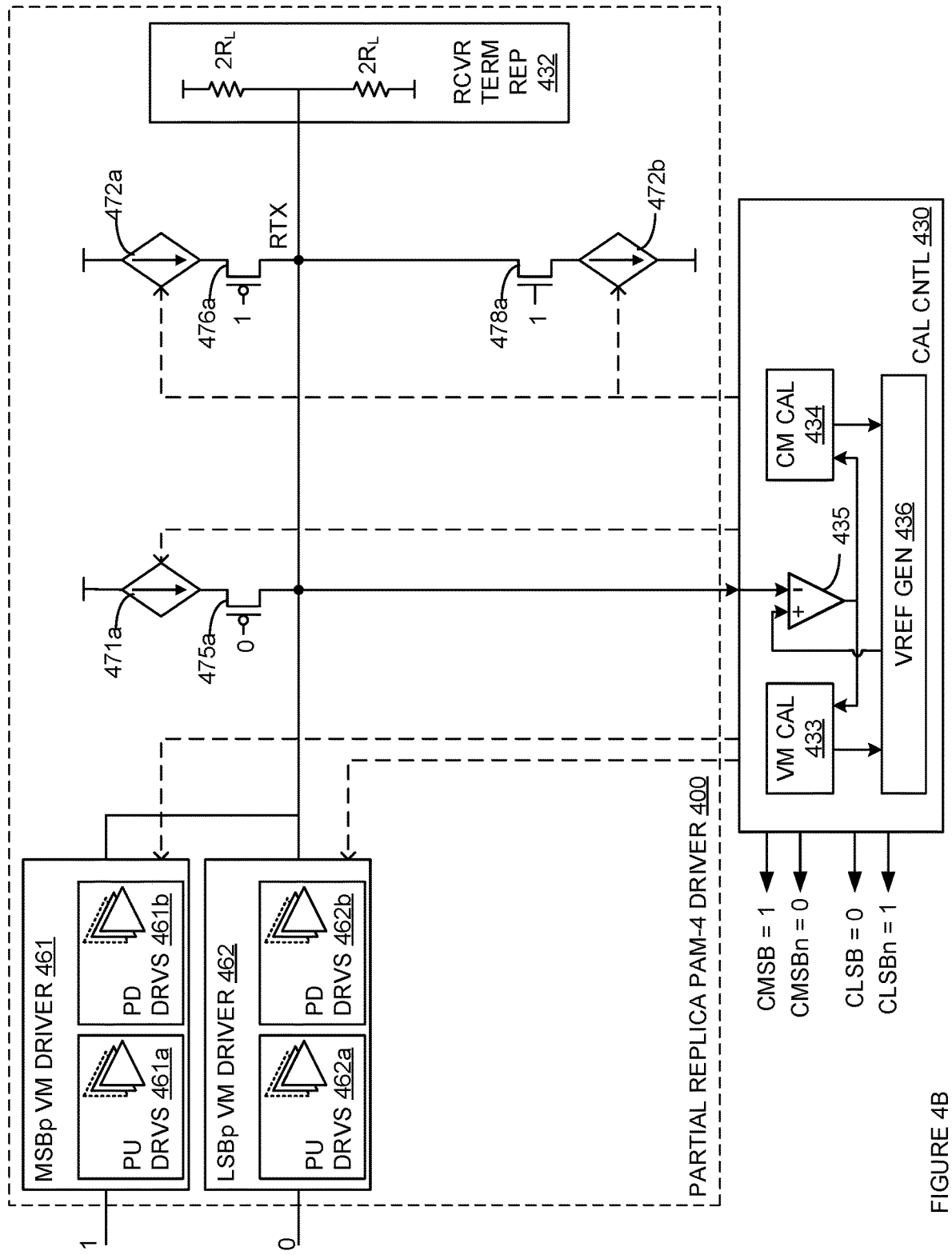
FIG. 4B is a diagram illustrating PAM-4 calibration circuitry and a partial replica PAM-4 driver configured to calibrate for current mode enhancement levels.
Figure 4C:
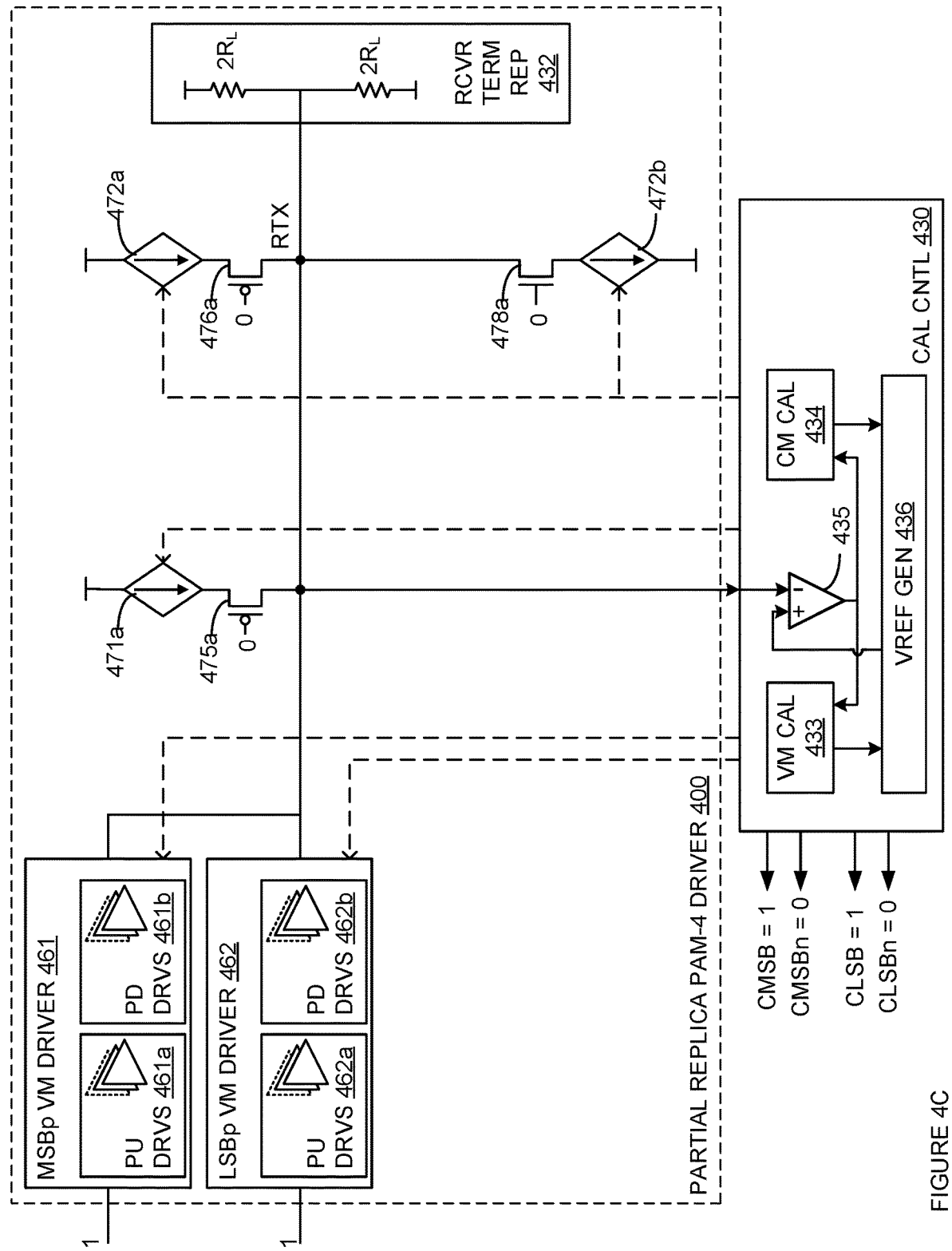
FIG. 4C is a diagram illustrating PAM-4 calibration circuitry and a partial replica PAM-4 driver configured to calibrate for ratio level mismatch.

FIG. 4A is a diagram illustrating PAM-4 calibration circuitry that uses a partial replica PAM-4 driver for calibration. In FIGS. 4A-4C, partial driver 400 includes a subset of the circuitry included in a full (e.g., PAM-4 driver 300) PAM-4 driver. By not including PAM-4 driver circuitry not needed for calibration purposes, partial PAM-4 driver 400 is less expensive to manufacture than using a complete PAM-4 driver for calibration purposes (though it should be understood that a complete PAM-4 could be used.) Partial driver 400 comprises MSBp VM driver 461 (which corresponds to MSBp VM driver 361), LSBp VM driver 462 (which corresponds to MSBp VM driver 361), controlled current source 471a (which corresponds to current source 371a), controlled current source 472a (which corresponds to current source 372a), controlled current source 472b (which corresponds to current source 372b), PFET 475a, PFET 476a, and NFET 478a.

The calibration configurations of partial driver 400 are controlled by calibration control 430 using the complementary signals CMSB and CMSBn and the complementary signals CLSB and CLSBn. CMSB is provided to MSBp VM driver 461. CMSBn (the logical complement/inversion of CMSB) is provided to the gate of PFET 475a. CLSB is provided to CLSBp VM driver 462. CLSBn (the logical complement/inversion of LSB) is provided to the gate of PFET 476a and the gate of NFET 478a. The outputs of MSBp VM driver 461 and LSBp VM driver 462 are connected to the replica transmit/output node RTX. An on-die receiver termination impedance replica 432 is also connected to the replica transmit/output node RTX.

Controlled current source 471a sources a controlled current (e.g., from a positive supply voltage-$V_{DD}$) to the source node of PFET 475a. The gate of PFET 475a is connected to CMSBn. The drain of PFET 475a is connected to RTX. Controlled current source 472a sources a controlled current (e.g., from a positive supply voltage-$V_{DD}$) to the source node of PFET 476a. Controlled current source 472b sinks a controlled current from the source nodes of NFET 478a (e.g., to a negative supply voltage-$V_{ss}$.) The gate of PFET 476a is connected to CLSBn. The drain of PFET 476a is connected to RTX. The gate of NFET 478a is connected to CLSBn. The drain of NFET 478a is connected to RTX.

Calibration control 430 includes voltage mode calibration circuitry 433 (e.g., a finite state machine), current mode calibration circuitry 434, comparator 435, and reference voltage (VREF) generator 436. The output of comparator 435 is operatively coupled to VM calibration 433 and CM calibration 434. VM calibration 433 and CM calibration 434 may control VREF generator to provide a selected voltage to a first input of comparator 435. VREF generator may include a resistive ladder network to generate the voltages to be selected by VM calibration 433 and CM calibration 434. A second input to comparator 435 (e.g., the inverting input) is connected to RTX.

Calibration control circuitry 430 determines calibration settings will be provided to PAM-4 drivers (e.g., PAM-4 drivers 110, 213, 223, and/or 300.)

MSBp VM driver 461 includes pullup drivers 461a and pulldown drivers 461b. Pullup drivers 461a may be, for example, replicas of the selectively enabled/disabled PFETs of PAM-4 driver 300. Pulldown drivers 461b may be, for example, replicas of the selectively enabled/disabled NFETs of PAM-4 driver 300.

Pullup drivers 461a may be selectively enabled/disabled by VM calibration 433 in order to search for a combination of pullup drivers 461a that provides a selected termination/drive impedance. For example, when pullup drivers 461a are driving (i.e., CMSB=1), VM calibration 433 may search for a combination of enabled/disabled pullup drivers 461a that provides a selected termination impedance of 3 $R_L$/2, where $R_L$ is the receiver termination impedance. Similarly, pulldown drivers 461b may be selectively enabled/disabled by VM calibration 433 in order to search for a combination of pulldown drivers 461b that provides a selected termination/drive impedance. For example, when pulldown drivers 461b are driving (i.e., CMSB=0), VM calibration 433 may search for a combination of enabled/disabled pulldown drivers 461b that provides a selected termination impedance of 3 $R_L/2$, where $R_L$ is the receiver termination impedance.

LSBp VM driver 462 includes pullup drivers 462a and pulldown drivers 462b. Pullup drivers 462a may be, for example, replicas of the selectively enabled/disabled PFETs of PAM-4 driver 300. Pulldown drivers 462b may be, for example, replicas of the selectively enabled/disabled NFETs of PAM-4 driver 300.

Pullup drivers 462a may be selectively enabled/disabled by VM calibration 433 in order to search for a combination of pullup drivers 462a that provides a selected termination/drive impedance. For example, when pullup drivers 462a are driving (i.e., CLSB=1), VM calibration 433 may search for a combination of enabled/disabled pullup drivers 462a that provides a selected termination impedance of 3 $R_L$, where $R_L$ is the receiver termination impedance. Similarly, pulldown drivers 462b may be selectively enabled/disabled by VM calibration 433 in order to search for a combination of pulldown drivers 462b that provides a selected termination/drive impedance. For example, when pulldown drivers 462b are driving (i.e., CLSB=0), VM calibration 433 may search for a combination of enabled/disabled pulldown drivers 462b that provides a selected termination impedance of $3R_L$, where $R_L$ is the receiver termination impedance.

Partial driver 400 includes controlled current source 471a, controlled current source 472a, and controlled current source 472b. Controlled current source 471a, controlled current source 472a, and controlled current source 472b may be, for example, respective replicas of controlled current source 371a, controlled current source 372a, and controlled current source 372b of PAM-4 driver 300. Likewise, PFET 475a, PFET 476a, and NFET 478a may be respective replicas of PFET 375a, PFET 376a, and NFET 378a of PAM-4 driver 300.

The currents flowing through controlled current source 471a, controlled current source 472a, and controlled current source 472b selectively adjusted by CM calibration 434 in order to search for a combination of currents sourced to and sunk from RTX that provide a selected differential swing enhancement and/or to reduced non-linearity.

FIG. 4B is a diagram illustrating PAM-4 calibration circuitry and a partial replica PAM-4 driver configured to calibrate for current mode enhancement levels. In FIG. 4B, CM calibration has set CMSB=1 (thus CMSBn=0) and CLSB=0 (thus CLSBn=1). Thus, pullup drivers 461a are driving RTX with the desired source impedance set (after a search) by VM calibration 433, controlled current source 471a is sourcing current to RTX via PFET 475a, and controlled current source 472b is sinking current from RTX via NFET 478a. Controlled current source 472a is blocked by PFET 476a from sourcing current to RTX.

In an embodiment, CM calibration 434 may control VREF generator 436 to supply the first input (e.g., non-inverting input) of comparator 435 with the following reference voltage: $V_{REF}=(7/12)*V_{DD}+\Delta V/12$, where $\Delta V$ is a desired differential voltage swing enhancement to be provided by CM portions of PAM-4 driver 300. While in this configuration, CM calibration 434 may search for a combination of currents through controlled current source 471a (e.g., $I_{MSB}$) and through controlled current source 472b (e.g., $I_{LSB}$) that provide the selected differential voltage swing enhancement of $\Delta V$.

FIG. 4C is a diagram illustrating PAM-4 calibration circuitry and a partial replica PAM-4 driver configured to calibrate for ratio level mismatch. In FIG. 4C, CM calibration has set CMSB=1 (thus CMSBn=0) and CLSB=1 (thus CLSBn=0). Thus, pullup drivers 461a and pullup drivers 462a are driving RTX with the desired source impedances determined (after searching) by VM calibration 433, controlled current source 471a is sourcing current to RTX via PFET 475a, and controlled current source 472a is sourcing current to RTX via PFET 476a. Controlled current source 472b is blocked by NFET 472b from sinking current from RTX.

In an embodiment, CM calibration 434 may control VREF generator 436 to supply the first input (e.g., non-inverting input) of comparator 435 with the following reference voltage: $V_{REF}=(3/4)*V_{DD}+\Delta V/4$, where $\Delta V$ is a desired differential voltage swing enhancement to be provided by CM portions of PAM-4 driver 300. While in this configuration, CM calibration 434 may search for a combination of currents through controlled current source 471a (e.g., $I_{MSB}$) and through controlled current source 472a (e.g., $I_{LSB}$) that reduce the ratio level mismatch of the PAM-4 levels to be output by PAM-4 driver 300. In particular, CM calibration 434 may adjust (i.e., to reduce RLM) the sum of the currents through controlled current source 471a (e.g., $I_{MSB}$) and through controlled current source 472a (e.g., $I_{LSB}$) while keeping the difference of these currents in the FIG. 4B cases constant. Keeping the difference of currents constant ensures the enhancement for the middle PAM-4 levels remains constant as the RLM is reduced. Thus, CM calibration 434 may repeatedly iterate through the configurations and adjustments shown and described in relation to FIG. 4B and FIG. 4C.

Figure 5:
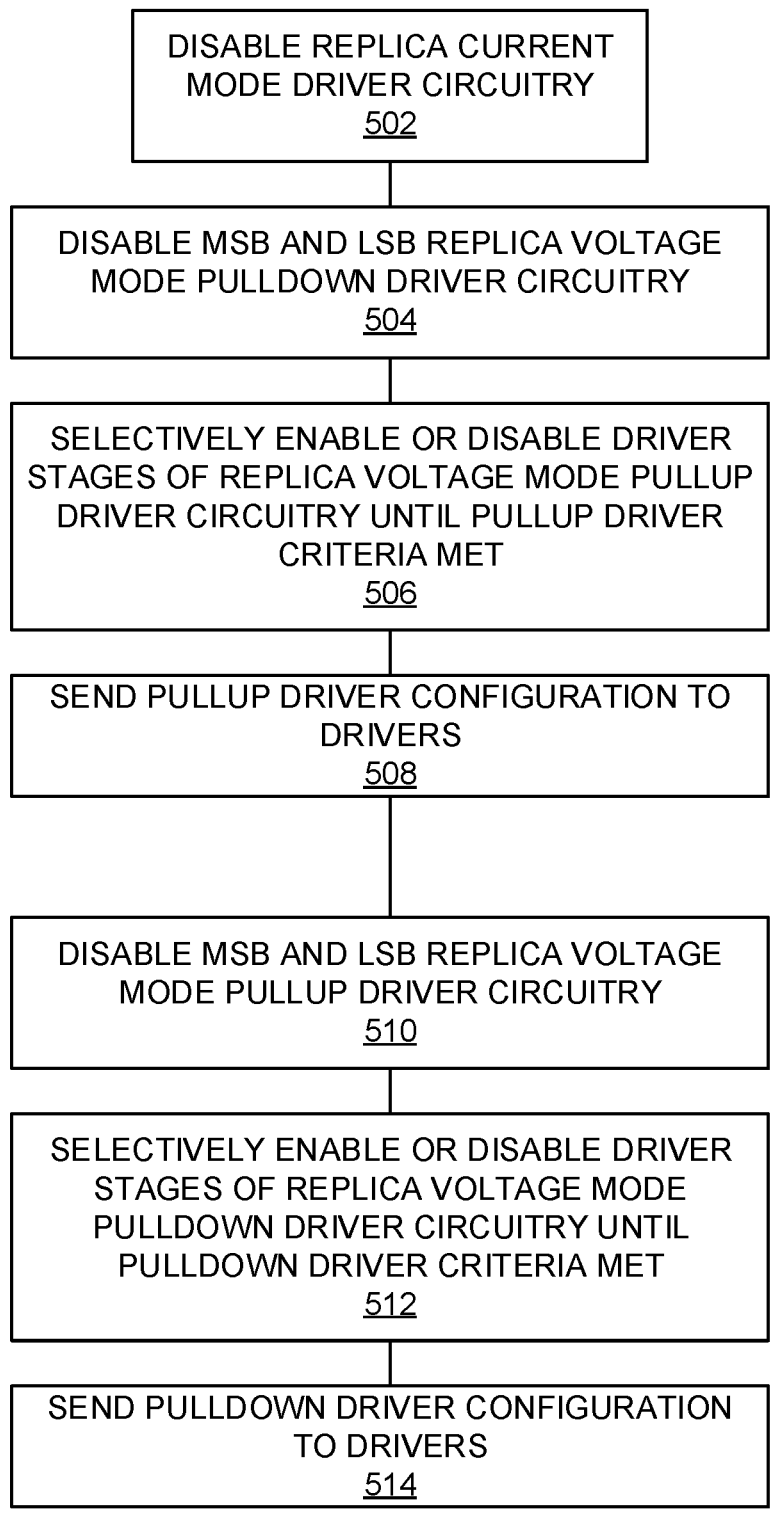
FIG. 5 is a flowchart illustrating a method of calibrating PAM-4 voltage mode circuitry.

FIG. 5 is a flowchart illustrating a method of calibrating PAM-4 voltage mode circuitry. Certain steps illustrated in FIG. 5 may be performed, for example, by one or more elements of system 100, system 200, calibration circuitry 330, calibration circuitry 430, and/or their components. Replica current mode driver circuitry is disabled (502). For example, VM calibration 433 may disable the CM circuitry of partial driver 400 by controlling current sources 471a, 472a, and 472b to not source and to not sink current to/from RTX.

Most significant bit and least significant bit voltage mode pulldown driver circuitry is disabled (504). For example, VM calibration 433 may disable voltage mode pulldown driver circuitry 461b and 462b by setting CMSB=1 and CLSB=1. Driver stages of replica voltage mode pullup driver circuitry is selectively enabled or disabled until a pullup driver criteria is met (506). For example, VM calibration 433 may selectively enabled/disabled pullup drivers 461a and/or 462a in order to search for a combination that provides a selected termination/drive impedance(s).

The pullup driver configuration is sent to drivers (508). For example, after determining combinations that provides the selected termination/drive impedance(s), calibration circuitry (e.g., calibration circuitry 130, calibration circuitry 330, or calibration control 430) may send signals to driver 110, drivers 213, drivers 223, and/or driver 300 that set these drivers to the selected pullup termination/drive impedance (s).

Most significant bit and least significant bit voltage mode pullup driver circuitry is disabled (510). For example, VM calibration 433 may disable voltage mode pulldown driver circuitry 461b and 462b by setting CMSB=0 and CLSB=0. Driver stages of replica voltage mode pullup driver circuitry is selectively enabled or disabled until a pulldown driver criteria is met (512). For example, VM calibration 433 may selectively enabled/disabled pulldown drivers 461b and/or 462b in order to search for a combination that provides a selected termination/drive impedance(s).

The pulldown driver configuration is sent to drivers (514). For example, after determining combinations that provides the selected termination/drive impedance(s), calibration circuitry (e.g., calibration circuitry 130, calibration circuitry 330, or calibration control 430) may send signals to driver 110, drivers 213, drivers 223, and/or driver 300 that set the pulldown drivers to the selected termination/drive impedance(s).

Figure 6:
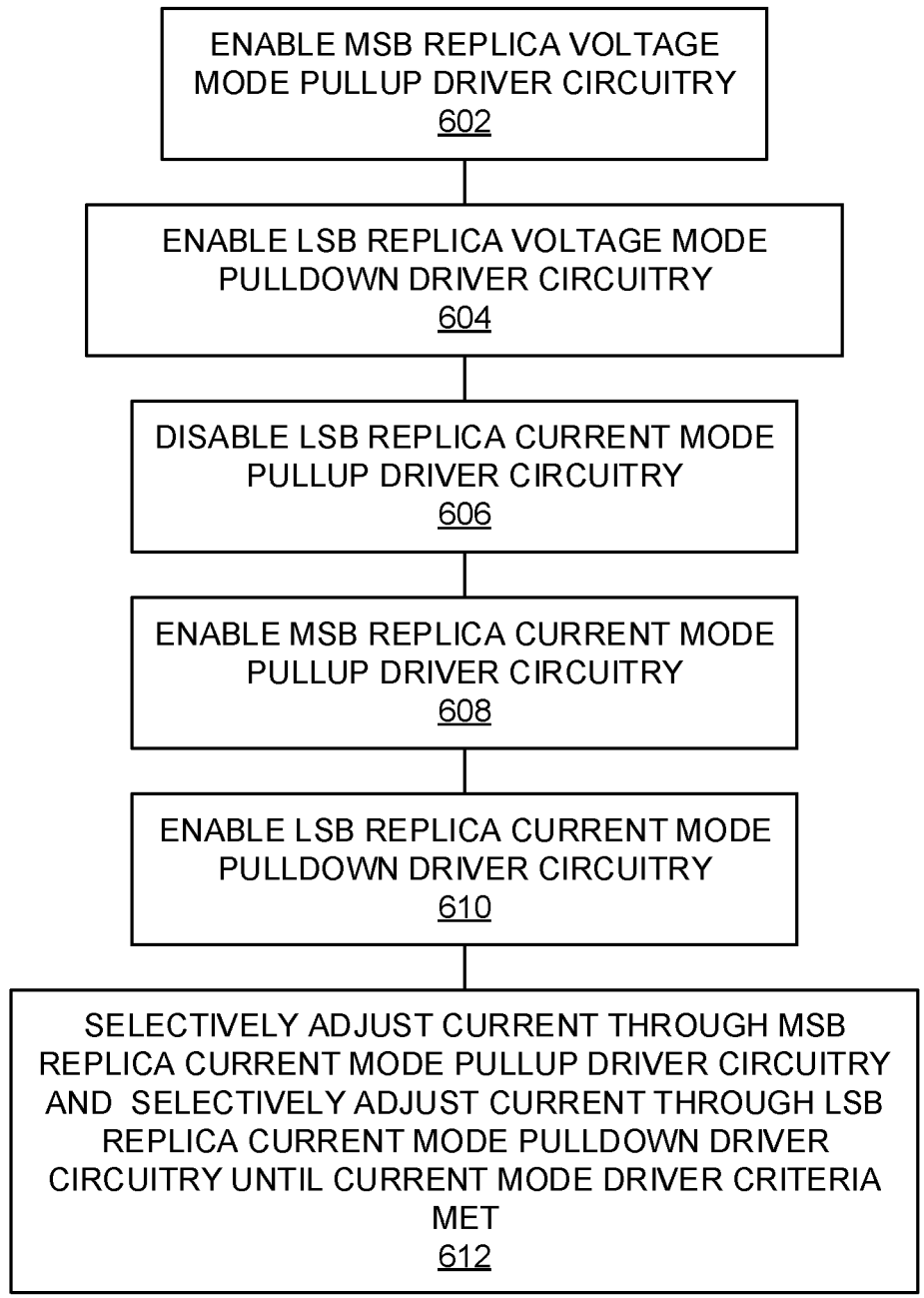
FIG. 6 is a flowchart illustrating a method of calibrating the enhancement levels provided by PAM-4 current mode circuitry.

FIG. 6 is a flowchart illustrating a method of calibrating the enhancement levels provided by PAM-4 current mode circuitry. Certain steps illustrated in FIG. 6 may be performed, for example, by one or more elements of system 100, system 200, calibration circuitry 330, calibration circuitry 430, and/or their components. Most significant bit replica voltage mode pullup driver circuitry is enabled (602). For example, CM calibration circuitry 434 may enable MSB pullup drivers 461a by setting CMSB=1.

Least significant bit replica voltage mode pulldown driver circuitry is enabled (604). For example, CM calibration circuitry 434 may enable LSB pulldown drivers 462b by setting CLSB=0. LSB replica current mode pullup driver circuitry is disabled (606). For example, CM calibration circuitry 434 may disable controlled current source 472a and/or block controlled current source 472a from sourcing current to RTX by setting PFET 476a to a non-conducting state.

Most significant bit replica current mode pullup driver circuitry is enabled (608). For example, CM calibration circuitry 434 may enable controlled current source 471a and allow controlled current source 471a to source current to RTX by setting PFET 475a to a conducting state (e.g., by setting CMSBn=0.) Least significant bit replica current mode pulldown driver circuitry is enabled (610). For example, CM calibration circuitry 434 may enable controlled current source 472b and allow controlled current source 472b to sink current from RTX by setting NFET 478a to a conducting state (e.g., by setting CLSBn=1.)

The current through MSB replica current mode pullup driver circuitry and the current through LSB replica current mode pulldown driver are selectively adjusted until a current mode driver criteria is met (612). For example, CM calibration 434 may control VREF generator 436 to supply the first input (e.g., non-inverting input) of comparator 435 with the following reference voltage: $V_{REF}=(7/12)*V_{DD}\Delta V/12$, where $\Delta V$ is a desired differential voltage swing enhancement. CM calibration 434 may search for a combination of currents through controlled current source 471a (e.g., $I_{MSB}$) and through controlled current source 472b (e.g., $I_{LSB}$) that provide the selected differential voltage swing enhancement of $\Delta V$.

Figure 7:
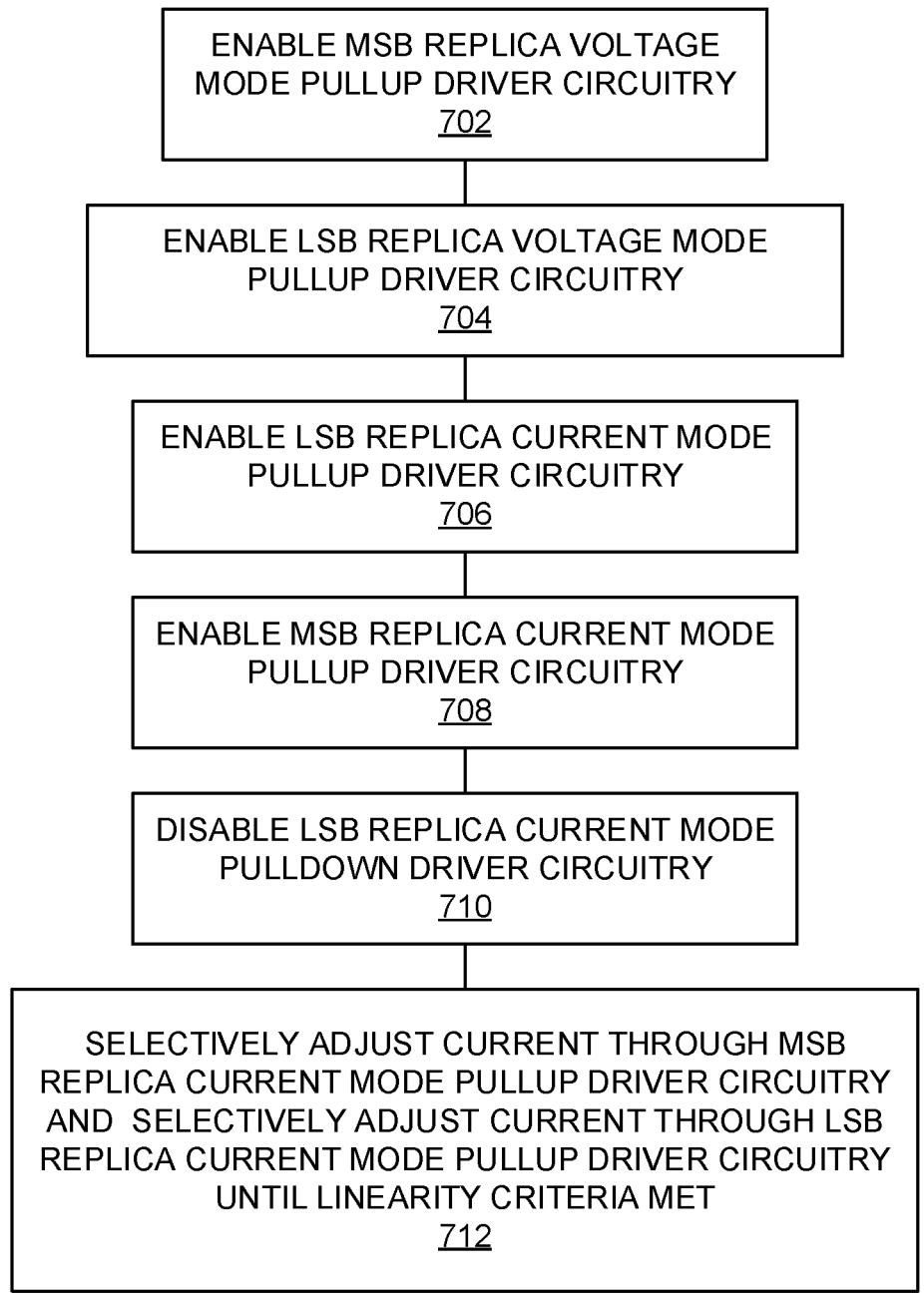
FIG. 7 is a flowchart illustrating a method of calibrating PAM-4 current mode circuitry to reduce ratio level mismatch.

FIG. 7 is a flowchart illustrating a method of calibrating PAM-4 current mode circuitry to reduce ratio level mismatch. Certain steps illustrated in FIG. 7 may be performed, for example, by one or more elements of system 100, system 200, calibration circuitry 330, calibration circuitry 430, and/or their components. Most significant bit replica voltage mode pullup driver circuitry is enabled (702). For example, CM calibration circuitry 434 may enable MSB pullup drivers 461a by setting CMSB=1.

Least significant bit replica voltage mode pullup driver circuitry is enabled (704). For example, CM calibration circuitry 434 may enable LSB pullup drivers 462a by setting CLSB=1. LSB replica current mode pullup driver circuitry is enabled (706). For example, CM calibration circuitry 434 may enable controlled current source 472a set PFET 476a to a conducting state (e.g., CLSBn=0.)

Most significant bit replica current mode pullup driver circuitry is enabled (708). For example, CM calibration circuitry 434 may enable controlled current source 471a and allow controlled current source 471a to source current to RTX by setting PFET 475a to a conducting state (e.g., by setting CMSBn=0.) Least significant bit replica current mode pulldown driver circuitry is disabled (710). For example, CM calibration circuitry 434 may disable controlled current source 472b and/or block controlled current source 472b from sinking current from RTX by setting NFET 478a to a non-conducting state (e.g., by setting CLSBn=0.)

The current through MSB replica current mode pullup driver circuitry and the current through LSB replica current mode pullup driver are selectively adjusted until a linearity criteria is met (712). For example, CM calibration 434 may search for a combination of currents through controlled current source 471a (e.g., $I_{MSB}$) and through controlled current source 472a (e.g., $I_{LSB}$) that improve the ratio level mismatch of the PAM-4 levels. In particular, CM calibration 434 may adjust (i.e., to increase RLM) the sum of the currents through controlled current source 471a (e.g., $I_{MSB}$) and through controlled current source 472a (e.g., $I_{LSB}$) while keeping the difference of these currents constant. Keeping the difference of currents constant ensures the enhancement for middle PAM-4 levels remains constant as RLM is reduced.

Figure 8A:
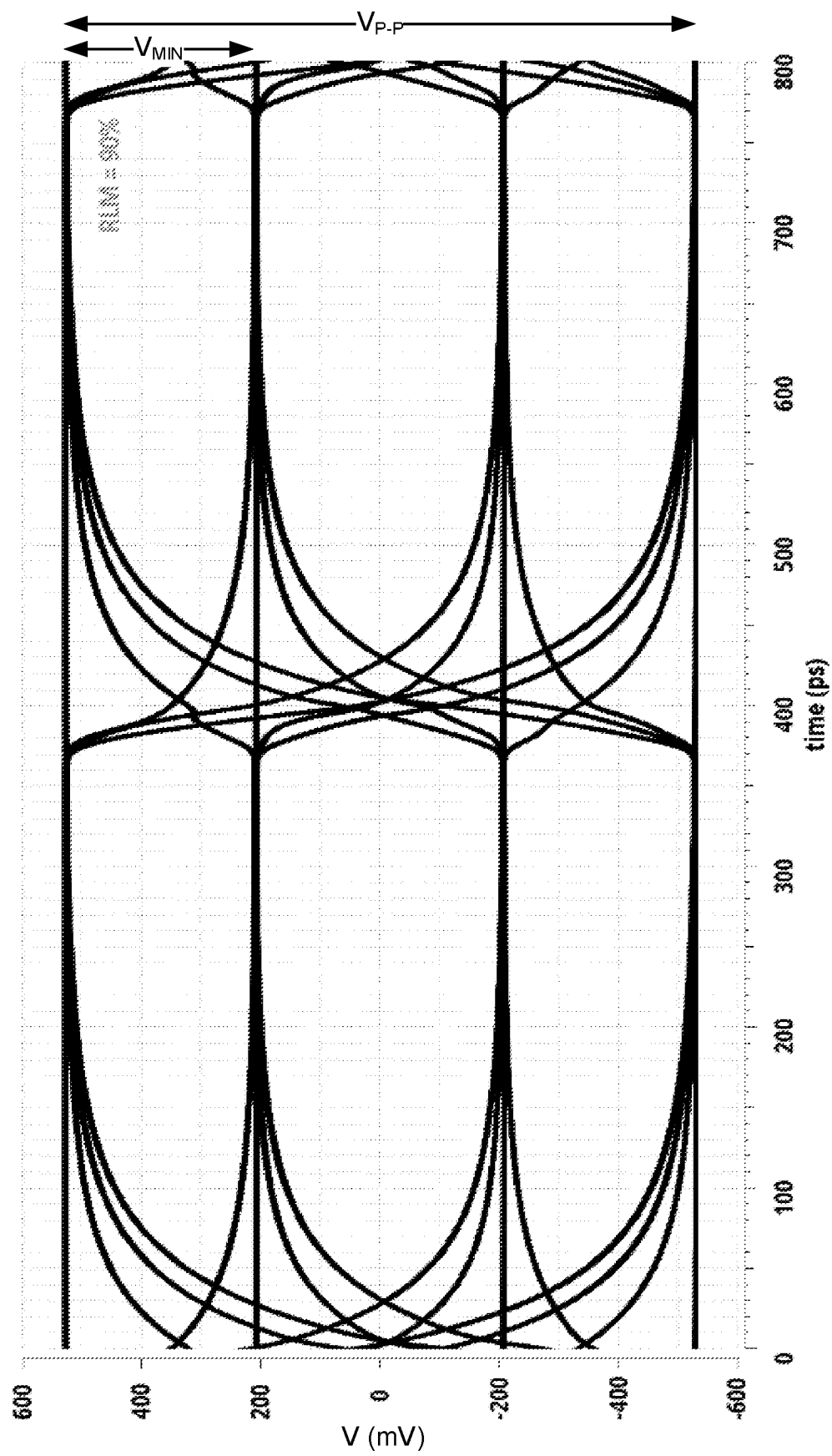
FIG. 8A is an eye diagram illustrating pre-calibration PAM-4 levels showing significant ratio level mismatch.
Figure 8B:
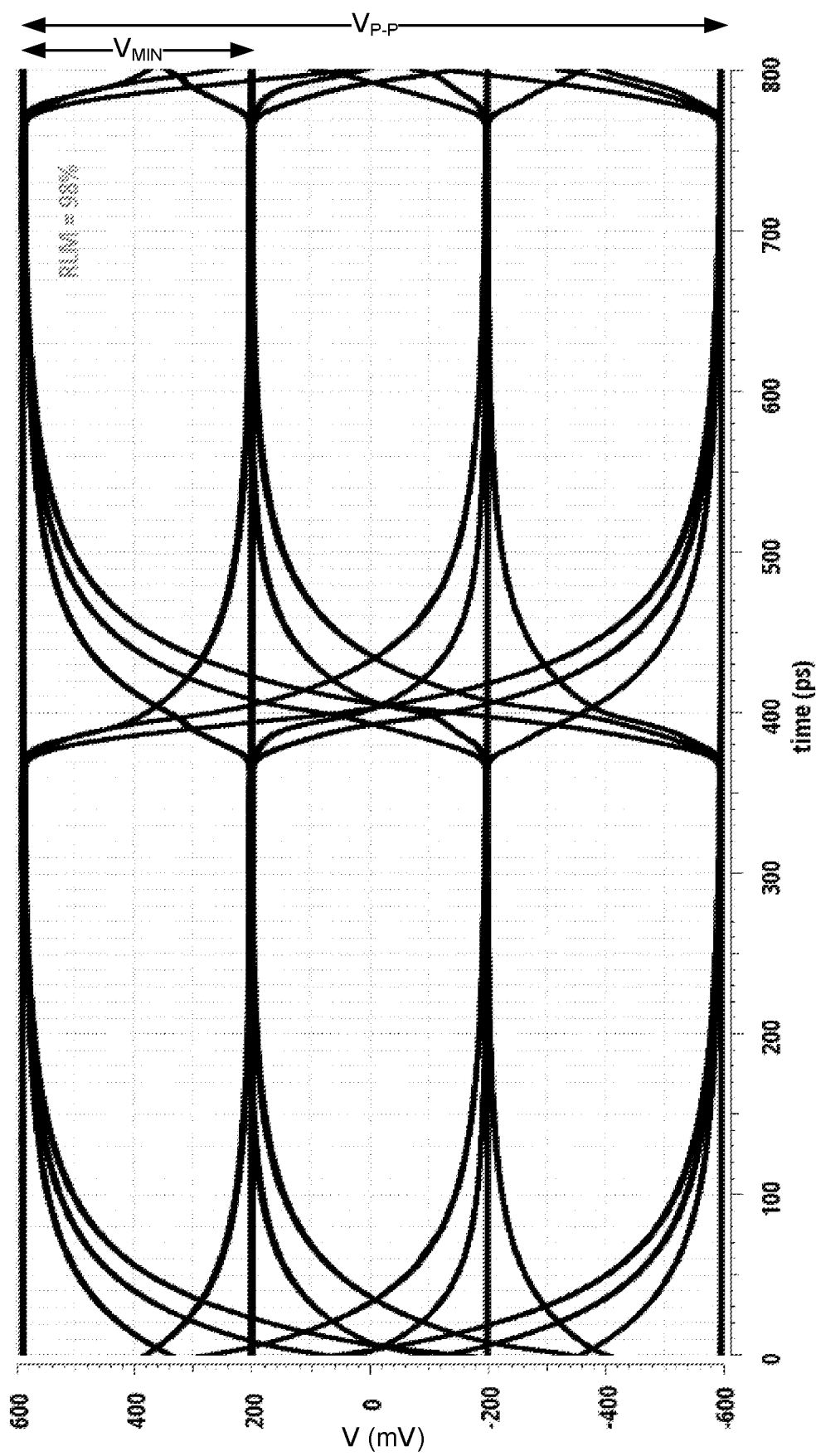
FIG. 8B is an eye diagram illustrating post-calibration PAM-4 level with reduced ratio level mismatch.

FIG. 8A is an eye diagram illustrating pre-calibration PAM-4 levels showing significant ratio level mismatch. FIG. 8B is an eye diagram illustrating post-calibration PAM-4 level with reduced ratio level mismatch.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of system 100, system 200, calibration circuitry 330, calibration circuitry 430, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 9:
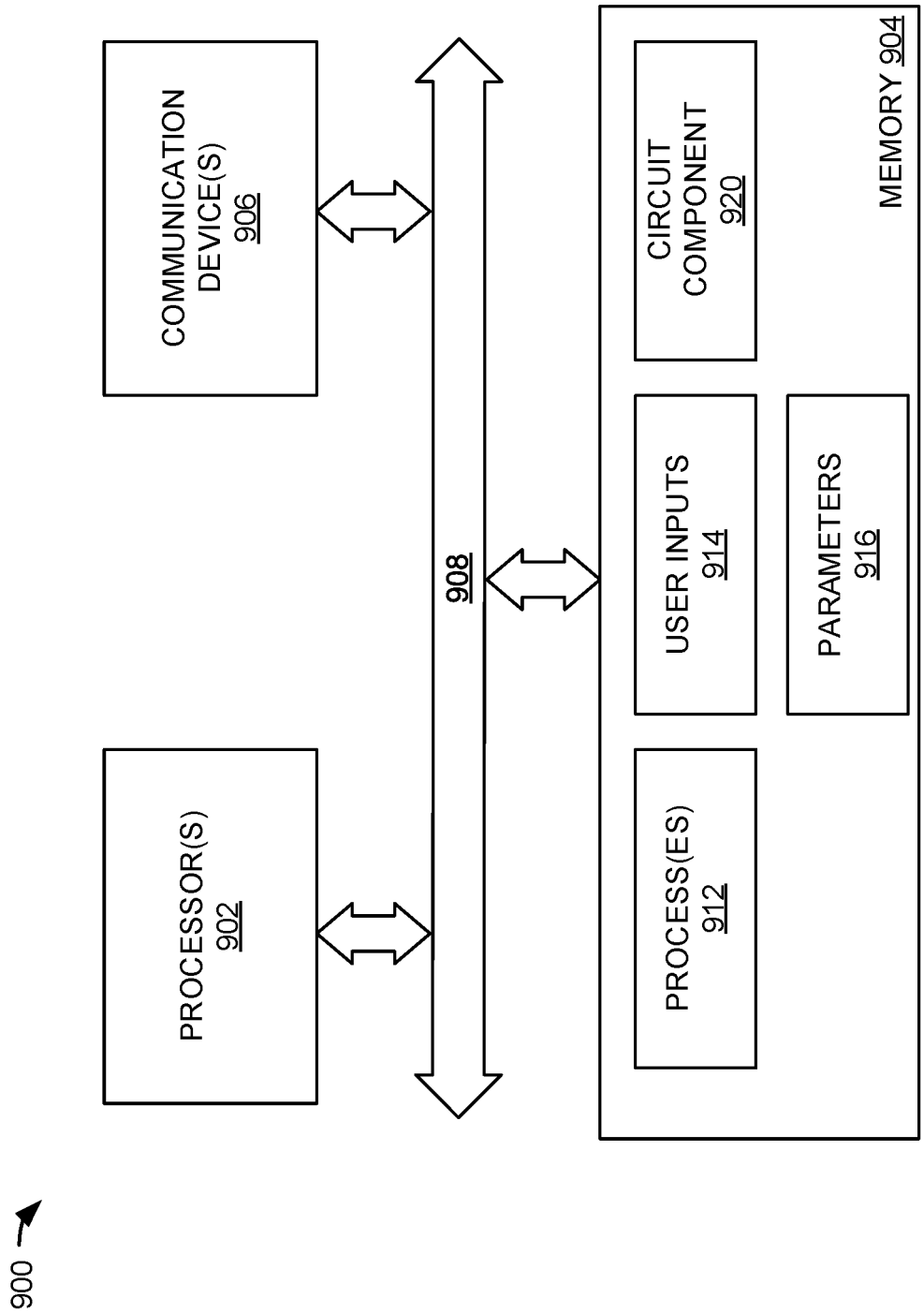
FIG. 9 is a block diagram of a processing system.

FIG. 9 is a block diagram illustrating one embodiment of a processing system 900 for including, processing, or generating, a representation of a circuit component 920. Processing system 900 includes one or more processors 902, a memory 904, and one or more communications devices 906. Processors 902, memory 904, and communications devices 906 communicate using any suitable type, number, and/or configuration of wired and/or wireless connections 908.

Processors 902 execute instructions of one or more processes 912 stored in a memory 904 to process and/or generate circuit component 920 responsive to user inputs 914 and parameters 916. Processes 912 may be any suitable electronic design automation (EDA) tool or portion thereof used to design, simulate, analyze, and/or verify electronic circuitry and/or generate photomasks for electronic circuitry. Representation 920 includes data that describes all or portions of system 100, system 200, calibration circuitry 330, calibration circuitry 430, and their components, as shown in the Figures.

Representation 920 may include one or more of behavioral, register transfer, logic component, transistor, and layout geometry-level descriptions. Moreover, representation 920 may be stored on storage media or communicated by carrier waves.

Data formats in which representation 920 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 914 may comprise input parameters from a keyboard, mouse, voice recognition interface, microphone and speakers, graphical display, touch screen, or other type of user interface device. This user interface may be distributed among multiple interface devices. Parameters 916 may include specifications and/or characteristics that are input to help define representation 920. For example, parameters 916 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 904 includes any suitable type, number, and/or configuration of non-transitory computer-readable storage media that stores processes 912, user inputs 914, parameters 916, and circuit component 920.

Communications devices 906 include any suitable type, number, and/or configuration of wired and/or wireless devices that transmit information from processing system 900 to another processing or storage system (not shown) and/or receive information from another processing or storage system (not shown). For example, communications devices 906 may transmit circuit component 920 to another system. Communications devices 906 may receive processes 912, user inputs 914, parameters 916, and/or circuit component 920 and cause processes 912, user inputs 914, parameters 916, and/or circuit component 920 to be stored in memory 904.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An integrated circuit, comprising:
   a differential four-level pulse amplitude modulation (PAM-4) driver to be calibrated, the PAM-4 driver comprising differential voltage mode driver circuitry and differential current mode driver circuitry; and
   calibration circuitry comprising:
      an on-die replica impedance of an external receiver termination impedance;
      a single-ended PAM-4 voltage mode driver that drives the replica impedance via a node and is configured to have a selectable number of voltage mode output stages enabled;
      a single-ended PAM-4 current mode driver configured to source a first selectable current to the node, sink a second selectable current from the node, and source a third selectable current to the node; and
   calibration control circuitry to:
      select a number of voltage mode output stages to be enabled to drive the node based on a comparison of a first reference voltage to a first voltage on the node;
      control the differential voltage mode driver circuitry to enable the number of voltage mode output stages;
      select a first current amount for the first selectable current and a second current amount for the second selectable current based on a comparison of a second reference voltage to a second voltage on the node;
      control the differential current mode driver circuitry to use the first current amount and the second current amount;
      select a third current amount for the third selectable current and a fourth current amount for the first selectable current based on a comparison of a third reference voltage to a third voltage one the node; and
      control the differential current mode driver circuitry to use the third current amount.

2. The integrated circuit of claim 1, wherein the first selectable current, the second selectable current, and the third selectable current are not sourced to, and not sunk from, the node during the comparison of the first reference voltage to the first voltage on the node.

3. The integrated circuit of claim 1, wherein the third selectable current is not sourced to the node during the comparison of the second reference voltage to the second voltage on the node.

4. The integrated circuit of claim 1, wherein the second selectable current is not sunk from the node during the comparison of the third reference voltage to the third voltage on the node.

5. The integrated circuit of claim 1, wherein the single-ended PAM-4 voltage mode driver includes a most-significant bit driver and a least-significant bit driver.

6. The integrated circuit of claim 5, wherein the least-significant bit driver is not driving the node during the comparison of the second reference voltage to the second voltage on the node.

7. The integrated circuit of claim 5, wherein the most-significant bit driver and the least-significant bit driver drive the node during the comparison of the third reference voltage to the third voltage on the node.

8. An integrated circuit with calibration circuitry, comprising:
- a four-level pulse amplitude modulation (PAM-4) voltage mode driver to drive an on-die replica impedance of an external receiver termination impedance via a node using a selectable number of voltage mode output stages enabled;
- a PAM-4 current mode driver to source a first selectable current to the node, sink a second selectable current from the node, and source a third selectable current to the node; and
- calibration control circuitry to select a number of voltage mode output stages to be enabled to drive the node based on a comparison of a first reference voltage to a first voltage on the node, select a first amount for the first selectable current and a second amount for the second selectable current based on a comparison of a second reference voltage to a second voltage on the node, and select a third amount for the third selectable current and a fourth amount for the first selectable current based on a comparison of a third reference voltage to a third voltage on the node.

9. The integrated circuit of claim 8, further comprising:
- controlled circuitry to, during the comparison of the first reference voltage to the first voltage on the node, prevent the first selectable current and the third selectable current from being sourced to the node, and prevent the second selectable current from being sunk from the node.

10. The integrated circuit of claim 8, further comprising:
- switch circuitry to, during the comparison of the second reference voltage to the second voltage on the node, prevent the third selectable current from being sourced to the node.

11. The integrated circuit of claim 8, further comprising:
- switch circuitry to, during the comparison of the third reference voltage to the third voltage on the node, prevent the second selectable current from being sunk from the node.

12. The integrated circuit of claim 8, wherein the PAM-4 voltage mode driver includes a most-significant bit driver and a least-significant bit driver.

13. The integrated circuit of claim 12, wherein the least-significant bit driver is not driving the node during the comparison of the second reference voltage to the second voltage on the node.

14. The integrated circuit of claim 12, wherein the most-significant bit driver and the least-significant bit driver drive the node during the comparison of the third reference voltage to the third voltage on the node.

15. A method of calibrating a four-level pulse amplitude modulation (PAM-4) driver, comprising:
- selecting a number of voltage mode output stages to be enabled to drive a PAM-4 type signal based on a comparison of a first reference voltage to a first voltage on an output node of a replica PAM-4 driver that is driving an on-die replica of a termination impedance, the replica PAM-4 driver including voltage mode output circuitry and current mode output circuitry, the current mode output circuitry configured to source a first selectable current to the output node, sink a second selectable current from the output node, and to source a third selectable current to the output node;
- selecting a first amount for the first selectable current and a second amount for the second selectable current based on a comparison of a second reference voltage to a second voltage on the output node of the replica PAM-4 driver that is driving the on-die replica of the termination impedance;
- selecting a third amount for the second selectable current and a fourth amount for the first selectable current based on a comparison of a third reference voltage to a third voltage on the output node;
- controlling the PAM-4 driver to enable the number of voltage mode output stages;
- controlling the PAM-4 driver to use the first amount for the first selectable current;
- controlling the PAM-4 driver to use the second amount for the second selectable current;
- controlling the PAM-4 driver to use the third amount for the second selectable current and;
- controlling the PAM-4 driver to use the fourth amount for the first selectable current.

16. The method of claim 15, further comprising:
- configuring controlled circuitry to, during the comparison of the first reference voltage to the first voltage on the output node, prevent the first selectable current and the third selectable current from being sourced to the output node, and prevent the second selectable current from being sunk from the output node.

17. The method of claim 15, further comprising:
- configuring switching circuitry to, during the comparison of the second reference voltage to the second voltage on the output node, prevent the third selectable current from being sourced to the output node.

18. The method of claim 15, further comprising:
- configuring switching circuitry to, during the comparison of the third reference voltage to the third voltage on the output node, prevent the second selectable current from being sunk from the output node.

19. The method of claim 15, wherein the replica PAM-4 driver includes a most-significant bit driver and a least-significant bit driver, and the method further comprises:
- configuring the least-significant bit driver to not drive the output node during the comparison of the second reference voltage to the second voltage on the node.

20. The method of claim 19, further comprising:
- configuring the most-significant bit driver and the least-significant bit driver to drive the output node during the comparison of the third reference voltage to the third voltage on the output node.

* * * * *